(12) United States Patent
Chen et al.

(10) Patent No.: US 8,293,572 B2
(45) Date of Patent: Oct. 23, 2012

(54) INJECTION MOLDING SYSTEM AND METHOD OF CHIP PACKAGE

(75) Inventors: Wen-Chuan Chen, Hukou Township, Hsinchu County (TW); Nan-Chun Lin, Hukou Township, Hsinchu County (TW)

(73) Assignee: ADL Engineering Inc., Hukou Township, Hsinchu County (TW)

( * ) Notice: Subject to any disclaimer, the term of this patent is extended or adjusted under 35 U.S.C. 154(b) by 62 days.

(21) Appl. No.: 13/010,192

(22) Filed: Jan. 20, 2011

(65) Prior Publication Data

US 2012/0187582 A1    Jul. 26, 2012

(51) Int. Cl.
*H01L 21/00* (2006.01)
(52) U.S. Cl. ............. 438/106; 438/15; 438/25; 438/26; 438/51; 438/55; 438/112; 438/124; 438/126; 438/127; 257/787
(58) Field of Classification Search .................. 438/106, 438/15, 25, 26, 51, 55, 64, 112, 124, 126, 438/127; 257/787
See application file for complete search history.

(56) References Cited

U.S. PATENT DOCUMENTS

| | | | |
|---|---|---|---|
| 7,214,562 B2* | 5/2007 | Lum et al. ...................... | 438/106 |
| 7,862,318 B2* | 1/2011 | Middleton et al. ............. | 425/112 |
| 2001/0021542 A1* | 9/2001 | Hultmark et al. .............. | 438/106 |
| 2004/0053443 A1* | 3/2004 | Kumamoto et al. ........... | 438/106 |
| 2007/0278639 A1* | 12/2007 | Bauer et al. .................... | 257/686 |
| 2011/0001269 A1* | 1/2011 | Denis et al. ................ | 264/328.8 |

* cited by examiner

*Primary Examiner* — Bradley K Smith
*Assistant Examiner* — Timor Karimy
(74) *Attorney, Agent, or Firm* — Kusner & Jaffe (57) ABSTRACT

The injection molding system comprises a substrate, an inner cover, a molding tool, and a bottom plate. The substrate is used to locate at least one semiconductor device under molding and the inner cover with at least one first injection via, cavity and runner placed over the substrate. In addition, the molding tool includes at least one second injecting via aligned with the runner and the bottom plate is placed under the substrate. Furthermore, a filling material is filled into the cavity and runner of the inner cover during molding. In order to avoid overflowing the filling material, the system further comprises an O-ring placed between the molding tool and the inner cover. The inner radius of the O-ring corresponds with the inner radius of the injection via and is aligned with it.

24 Claims, 6 Drawing Sheets

INJECTION MOLDING SYSTEM AND METHOD OF CHIP PACKAGE

FIELD OF THE INVENTION

The present invention relates to a chip package. More particularly, the present invention relates to an injection molding system and method for injection molding of a chip package to improve the performance of packaging structure and reduce the cost of manufacture.

BACKGROUND OF THE INVENTION

In semiconductor industries, the production of integrated circuits (ICs) mainly includes three steps: manufacturing a wafer, manufacturing integrated circuits and packaging the integrated circuits. A bare chip is formed after the steps of wafer manufacturing, circuit designing, mask manufacturing and wafer dicing. Each bare chip formed from dicing the wafer is electrically connected to an external signal through connecting points on each bare chip, and then the bare chip is encapsulated by a molding material. The purpose of the package is to prevent the bare chip from being damaged by humidity, heat and noise signals, and to provide the bare chip with an electrically connecting medium for electrically connecting the chip to an external circuit. As a result, the package step of the integrated circuit is completed.

A semiconductor package is a molded plastic or ceramic casing inside which is embedded one or more discrete or integrated electronic components connected and used within an electronic circuit. The discrete components are typically etched in silicon wafer before being cut and assembled in a package.

Figure 1A:
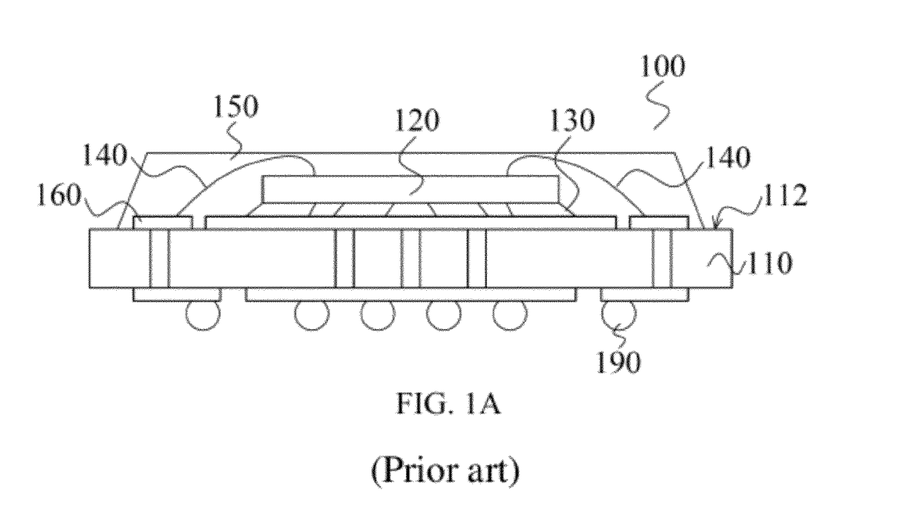
FIG. 1A is a cross-sectional view illustrating a conventional chip package.

FIG. 1A illustrates a cross-sectional view of a conventional chip package. The conventional chip package 100 comprises a package substrate 110, a chip 120, a silver epoxy layer 130, a plurality of wires 140, molding glue 150 and a conductive layer 160. The chip 120 is disposed on a carrying surface 112 of the package substrate 110. The silver epoxy layer 130 is disposed on the conductive layer 160, and both are disposed between the chip 120 and the carrying surface 112 to adhere the chip 120 onto the carrying surface 112 of the package substrate 110 and electrically connect the signal from chip 120 to the outside. It is known from the illustration in FIG. 1A that the chip 120 and the package substrate 110 are electrically connected to each other by the wires 140, i.e. the chip 120 and the package substrate 110 are connected by wire bonding. The molding glue 150 is to encapsulate and protect the wires 140 and to prevent the portion of surfaces of the chip 120 exposing.

A known conventional package process has several steps including die sawing, die mounting, wire bonding, molding, trimming/forming, marking, plating and inspection. In the production of the conventional chip package 100, each layer of the structure mentioned above is produced by a step.

Figure 1B:
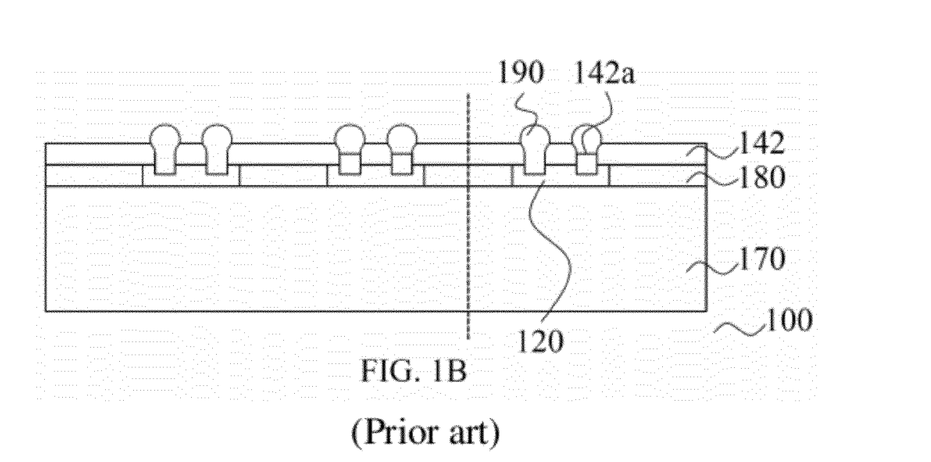
FIG. 1B is a schematic diagram illustrating the production of a conventional chip package.

FIG. 1B illustrates a diagram of the production of the conventional chip package. The first step of the conventional chip package 100, generally, a silicon substrate 170 and a plurality of chips 120 are provided. In the next step, the chips 120 are adhered to silicon substrate 110 by a conductive paste or adhesive tape. Then, a filling layer 180 can be formed on top of the silicon substrate 110 surrounding the peripheral of chips 120 to fill the gap between chips 120. The height of filling layer 180 should be approximately equal to the height of chips 120. At this step, the step of die bonding is already done.

After the above steps, a dielectric layer 142 is deposited on top of the filling layer 180 and chips 120, and then the dielectric layer 142 is patterned according to metal pads 126 on dies 120 to form thru-holes 142*a*. A silver epoxy layer 130, a conductive layer 160 and the substrate 110 are formed in sequence. A plurality of bonding points 190 are on bonding pads 142*a*. Finally, the silicon substrate 170 is released, and then the dicing is sawed.

However, the production of the conventional chip package has a complicated process and consumes much time and cost.

SUMMARY OF THE INVENTION

One object of the present invention is to reduce the cost and time of production of a chip package. The present invention provides an injection molding system and method thereof to shorten the process and reduce the time of package production effectively.

Another object of the present invention is to improve the stability of the package structure. The structure provided in the present invention is more stable than the conventional structure, which utilizes the addition of an inner cover before forming the filling layer.

For achieving the objects mentioned above, one embodiment of the present invention provides an injection molding system for a semiconductor package to predigest (i.e., simplify) the package process and reduce the cost, such as time, manpower or finance. The injection molding system comprises a substrate for locating at least one semiconductor device under molding, an inner cover with at least one first injection via, cavity and runner placed over the substrate for covering the semiconductor device under molding, a molding tool with at least one second injecting via aligned with the first injection via of the inner cover, and a bottom plate placed under the substrate. Furthermore, a filling material is filled into the cavity and runner of the inner cover during molding. In order to avoid the filling material overflowing, the system further comprises an O-ring placed between the molding tool and the inner cover. The inner radius of the O-ring corresponds with the inner radius of the first injection or second injection and aligned with those.

In one embodiment, the inner cover is defined by a top plate and a plurality of pillars arranged under the bottom of the top plate. Each pair of the pillars is placed by both sides of each semiconductor device. The first injection is configured on the top plate. The bottom plate further includes heat-function members, such as a heater or a heating plate to thermoform the filling material, if it is needed. The second adhesion layer is formed on the semiconductor device, which could be a conductive material, a non-conductive material or a thermoplastic material. The second adhesion layer fixes the inner cover and enhances the heat dissipation. The molding tool further includes checking windows to check a status of the filling material, like whether the filling material is overflowed when injecting the filling material.

The present invention also provides a method for injection molding of a semiconductor package for predigesting (i.e., simplifying) the package process. The method comprises the following steps: (a) providing a substrate for locating at least one semiconductor device under molding; (b) placing the semiconductor devices under molding on the substrate by a first adhesion layer; (c) placing an inner cover with at least one first injection via, cavity and runner over the substrate for covering the semiconductor device under molding; (d) placing a molding tool with at least one second injecting via on the inner cover and a bottom plate under the substrate, wherein the second injecting via is aligned with the first injection via of the inner cover; (e) injecting a filling material into the cavity and runner of the inner cover; and (f) releasing the molding tool, the bottom plate, the substrate and the first adhesion layer. The method further comprises the step of placing an O-ring between the molding tool and the inner cover before placing the molding tool on the inner cover to avoid overflowing the filling material. The inner radius of the O-ring corresponds with the inner radius of the second injecting via and is aligned with it.

Therefore, the semiconductor device or chip has embedded in the substrate by this injection molding system. Because this injection molding system is easy to use and which integrates two or more steps of a conventional package process, the package process would be effectively predigested (i.e., simplified). In other words, the present system effectively predigests the package process and reduces the cost of the package process. Then, at least one redistribution layer is formed over the semiconductor device, the filling material and the inner cover in a continuous step.

These merits given in the following embodiments and with reference to the accompanying drawings and claims will become clearly apparent to the reader.

DETAILED DESCRIPTION OF THE PREFERRED EMBODIMENT

The detailed description provided below in connection with the appended drawings is intended as a description of the preferred embodiments and is not intended to represent the only forms in which the present embodiments may be constructed or utilized. The description sets forth the functions of the example and the sequence of steps for constructing and operating the embodiments. However, the same or equivalent functions and sequences may be accomplished by different examples.

In accordance with common practice, the various described elements are not drawn to scale but are drawn to illustrate specific elements relevant to the present invention. Like reference numbers and designations in the various drawings indicate like elements.

The present invention discloses an injection molding system for a semiconductor package and the method thereof to improve the performance of packaging structure and reduce the cost of manufacture. In order to predigest the package process for reducing the time or cost of manufacture, the present invention provides an injection molding system for a package process.

Figure 2A:
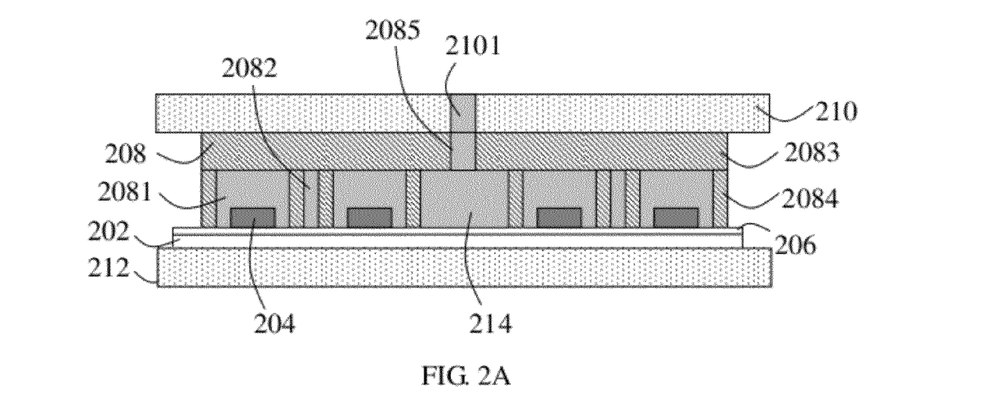
FIG. 2A is a cross-sectional view illustrating the injection system for a semiconductor package of the present invention.

FIG. 2A illustrates a schematic diagram of one embodiment of an injection molding system according to the present invention. The injection molding system 200 comprises a substrate 202 for locating at least one semiconductor device under molding 204; an inner cover 208 with at least one first injection via 2085, cavity 2081 and runner 2082 placed over the substrate for covering the semiconductor device under molding 204; a molding tool 210 with at least one second injecting via 2101 aligned with the first injection 2085 of the inner cover 208; and a bottom plate 212 placed under the substrate 202. Furthermore, a filling material 214 is filled into the cavity 2081 and runner 2082 of the inner cover 208. Thus, the filling material 214 would be between the inner cover 208 and the substrate 202.

Figure 2B:
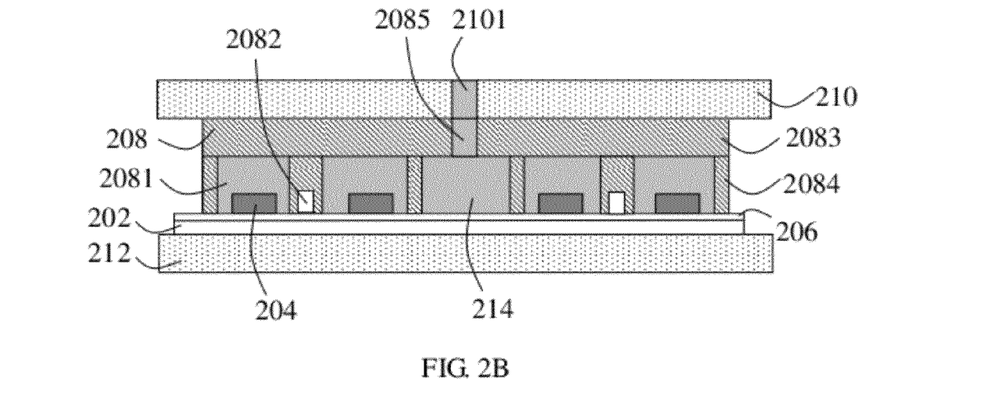
FIG. 2B is a cross-sectional view illustrating the injection system for a semiconductor package of another embodiment of the present invention.
Figure 2C:
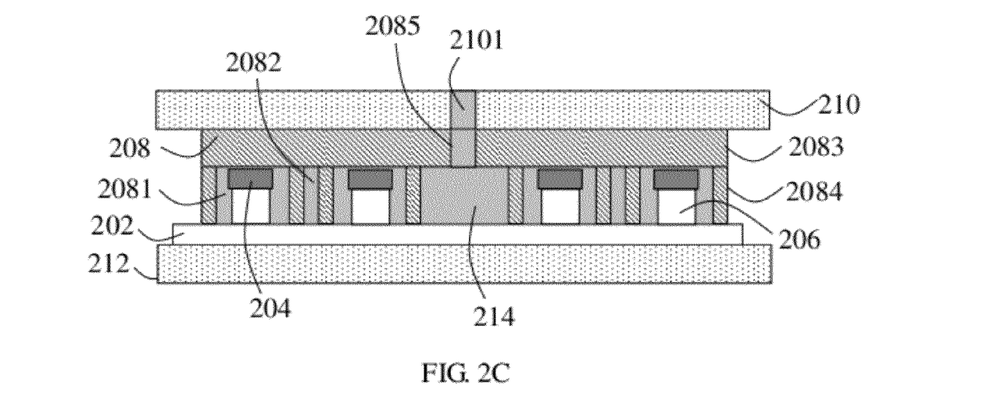
FIG. 2C is a cross-sectional view illustrating the injection system for a semiconductor package of another embodiment of the present invention.

In one embodiment, the injection molding system 200 further comprises a first adhesion layer 206 which includes an elastic material. The first adhesion layer 206 is patterned for improving contrapuntal effect like the function of alignment key. As shown in FIG. 2A, the preferred embodiment, the first adhesion layer 206 is flat and the semiconductor device under molding 204 would be configured on the first adhesion layer 206. In another embodiment, the first adhesion layer 206 is uneven, as shown in FIG. 2C. It includes at least one protruding part under the semiconductor devices 204 to raise the semiconductor device 204 and fix it to avoid moving during injection.

In one embodiment, the inner cover 208 is also, but not limited to, configured on the first adhesion layer 206. Since the first adhesion layer 206 is elastic, the interspaces between the first adhesion layer 206 and the inner cover 208 could be reduced by the downward pressure of the inner cover 208. In another embodiment, the inner cover 208 is configured on the substrate 202 directly, as shown in FIG. 2C.

The inner cover 208 has at least one first injection via 2085, cavity 2081 and runner 2082. The cavity 2081 and the runner 2082 of the inner cover 208 are defined by a top plate 2083 and a plurality of pillars 2084 arranged under the bottom of the top plate 2083. As shown in FIG. 2A, the cavity 2081 is formed by a pair of the pillars 2084 and the runner 2082 is formed by each two cavity 2081. Each pair of the pillars 2084 is placed by both sides of each semiconductor device under molding 204. In addition, the first injection via 2085 is configured on the top plate 2083. In another embodiment of the runner 2082, the runner 2082 is formed by each pillar 2084 with a hole 2086 for passing through the filling material 214, as shown in FIG. 2B. The inner cover 208 is used to fix and form the filling material 214. Besides, it would be a part of the package structure, which will enhance the structure force of the package structure. The inner cover 208 comprises, but is not limited to, FR4, FR5, conductive material, metal or alloy.

Figure 3:
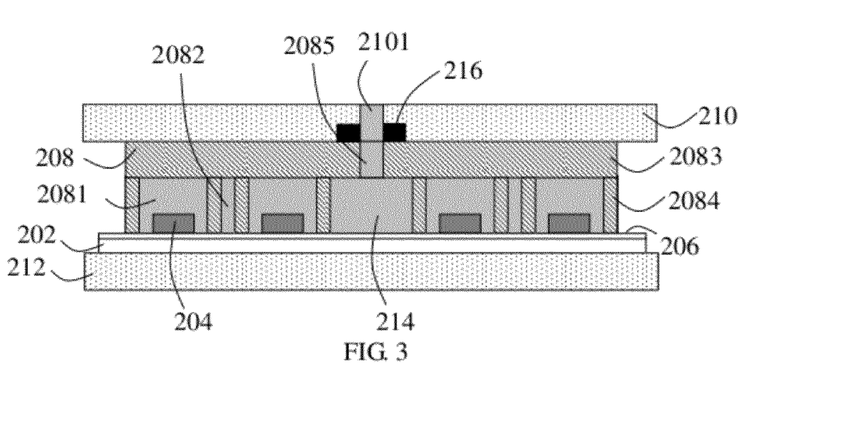
FIG. 3 is a cross-sectional view illustrating the injection system for a semiconductor package of another embodiment of the present invention.

Since the cavity 2081 and runner 2082 of the inner cover 208 is an enclosed vacuum, the pressure of which is higher than 1 atm, it is easy to overflow when injecting the filling material 214. In another embodiment, in order to avoid overflowing the filling material 214, the system 200 further comprises an O-ring 216 placed between the molding tool 210 and the inner cover 208, wherein the inner radius of the O-ring 216 corresponds with the inner radius of the second injection via 2085 and aligned with it, as shown in FIG. 3. The O-ring 216 is projected slightly from the surface of the inner cover 208 when beginning to configure the O-ring on the top surface of the inner cover 208. While the molding tool 210 is placed on the inner cover 208, the molding tool 210 provides a downward pressure to the O-ring 216. The O-ring 216 undergoes pressure deformation, and then the molding tool 210 would be completely configured on the top of the inner cover 208 without a gap.

Figure 4:
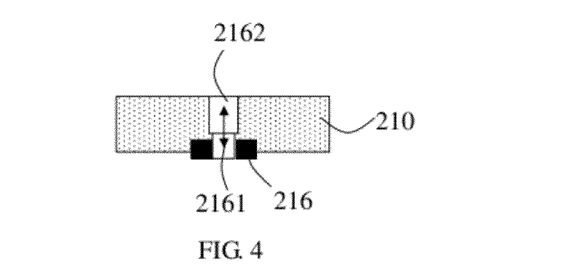
FIG. 4 is a schematic diagram illustrating the O-ring with a tube in the injection via interacting with the molding tool.

The filling material 214 usually overflows and spills out of the molding tool 210 when the filling material 214 is injected into the space between the inner cover 208 and the substrate 202, i.e. the cavity 2081 and the runner 2082 of the inner cover 208. The O-ring 216 could avoid spill of the filling material 214. In some embodiments, the O-ring 216 further includes a tube 2161 surrounded by the O-ring 216 in the second injection via 2101. FIG. 4 is a schematic diagram illustrating the O-ring 216 with a tube 2161 inserted in the second injection via 2101 interacting with the injection tool 2162. The tube 2161 is inserted into the second injecting via 2101 of the molding tool 210 and an additional injection tool 2162 is added on the tube 2161 to adjust the demanded injection pressure. In other words, the filling material 214 is injected into the cavity 2081 and the runner 2082 in accordance with the inside pressure of it. The filling material 214 is selected from, but not limited to, Cu or another substitute material.

In one embodiment, the molding tool 210 further includes a plurality of checking windows or a checking pool (not shown) for checking the filling status, like injection pressure or the filling material volume, to check whether the filling material 214 is completely filled in the cavities 2081 and runner 2082 of the inner cover 208. This could also reduce overflowing of the filling material 214 and prevent it opportunely.

In this embodiment, the bottom plate 212 includes a heater (not shown), such as a heat sink, for heating the bottom plate 212 and forming the filling material 214. Some filling materials 214 are formed by a heating process, such as a thermoplastic material, so that the heater would heat the bottom plate 212 and raise the temperature to the forming point of the filling material 214.

Figure 5:
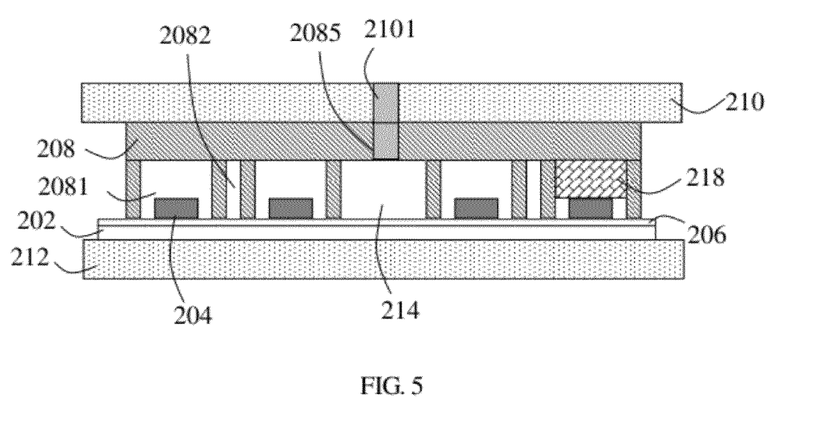
FIG. 5 is a schematic diagram illustrating another embodiment of the injection molding system.

FIG. 5 illustrates another embodiment of the injection molding system. In another embodiment, the injection molding system 200 further comprises a second adhesion layer 218, which is formed on the semiconductor device under molding 204. The second adhesion layer 218 is used to fix the inner cover 208 for avoiding moving its position during injection. Because the pressure of which is higher, the inner cover 208 is usually moved from the original position when injecting the filling material 214 into the cavity 2081 and runner 2082 of the inner cover 208. The second adhesion layer 218 could fix the inner cover 208 and prevent it from moving away from the original position. The second adhesion layer 218 comprises, but is not limited to, a conductive material or a non-conductive material.

It should be noted that the some structure of the injection molding system 200, such as the substrate, the semiconductor, and the first adhesion layer, are not the major features of the present invention and are generally used in a conventional package structure. For example, the substrate is selected from, but not limited to, a group consisting of a glass, a ceramic, a metal and an alloy, and the semiconductor device comprises, but is not limited to, a packaged semiconductor device.

The present invention also provides a method for injection molding of a chip package. FIG. 6A to FIG. 6H is a flow chart illustrating a method for injection molding of a chip package according to the present invention. As will be clear from the discussion herein below, the present embodiment may predigest the package process and thus reduce the cost of the package process.

Figure 6A:
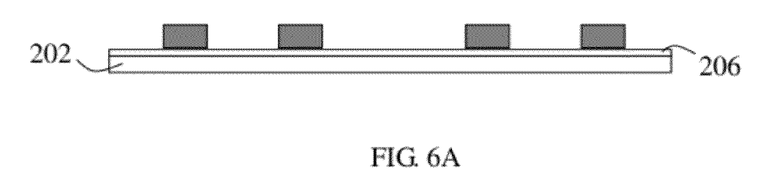
FIG. 6A to 6G is a flow chart illustrating a method for injection molding of a chip package according to the present invention.

First, as shown in FIG. 6A, a substrate 202 for locating at least one semiconductor device under molding 204 is provided. As above mentioned, the substrate 202 is selected from a group consisting of, but not limited to, a glass, a ceramic, a metal and an alloy, and the semiconductor device under molding comprises, but is not limited to, a packaged semiconductor device. Then, the semiconductor device under molding 204 is placed on the substrate 202 by a first adhesion layer 206. The first adhesion layer 206 could be configured on the whole surface of the substrate 202, or could be configured only on the placing position of the semiconductor device under molding 204.

In another embodiment, after the first step, there further comprises placing a second adhesion layer on the semiconductor device under molding, as shown by FIG. 5. The second adhesion layer 218 is used to fix the inner cover 208 to avoid moving its position by the higher inner pressure during injection. The second adhesion layer 218 comprises, but is not limited to, a conductive material or a non-conductive material.

Figure 6B:
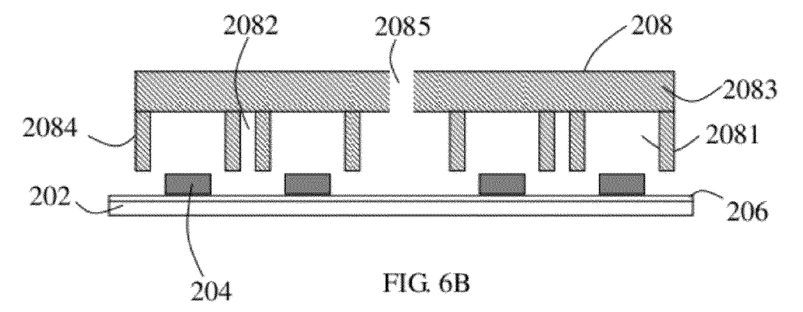

Next, an inner cover 208 with at least one first injection via 2085, cavity 2081 and runner 2082 is placed over the substrate 202 for covering the semiconductor device under molding 204. The cavity 2081 and the runner 2082 are defined by a top plate 2083 and a plurality of pillars 2084 arranged under the bottom of the top plate 2083. As shown in FIG. 6B, the cavity 2081 is formed by a pair of the pillars, and the runner 2082 is formed by each two pair of the pillars. Each pair of the pillars is placed by both sides of each semiconductor device under molding 204. The inner cover 208 is used to fix and form the filling material 214. Besides, it would be a part of the package structure which will enhance the structure force of the package structure. The inner cover 208 comprises, but is not limited to, FR4, FR5, conductive material, metal or alloy.

Figure 6C:
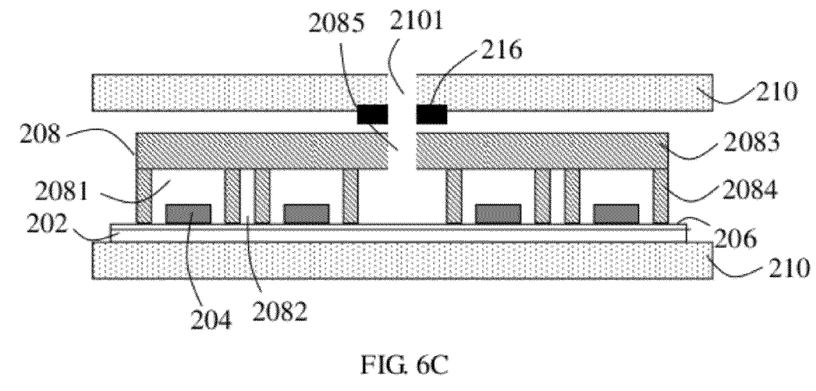

Then, a molding tool 210 with at least one second injecting via 2101 is placed on the inner cover 208. The second injecting via 2101 would be aligned with the first injection via 2085 of the inner cover 208 for injecting the filling material 214 into the cavity 2081 and the runner 2082 of the inner cover 208. Similarly, a bottom plate 212 is placed under the substrate 202 at the same time, as shown in FIG. 6C.

Figure 6D:
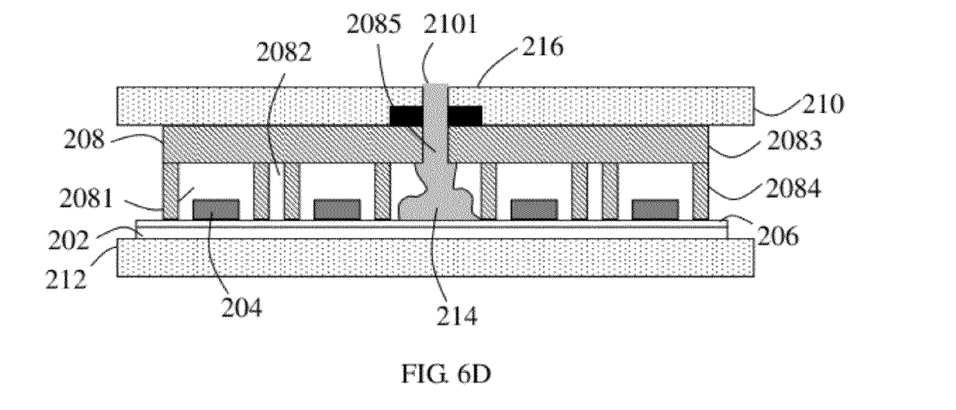

After placing all of the injection molding system 200, a filling material 214 is injected into the cavity 2081 and the runner 2082 of the inner cover 208 through the first and second injecting via 2085, 2101. That means the filling material would be injected between the inner cover 208 and the substrate 202, as shown in FIG. 6D.

Some filling material 214 should be formed by heat, such as a thermoplastic material, In one embodiment, the bottom plate 212 includes a heater (not shown), such as a heat sink, for heating the bottom plate 212 and forming the filling material 214 needed to heat. Therefore, heating the bottom plate 212 to form the filling material 214 is the next step in some embodiment.

Figure 6E:
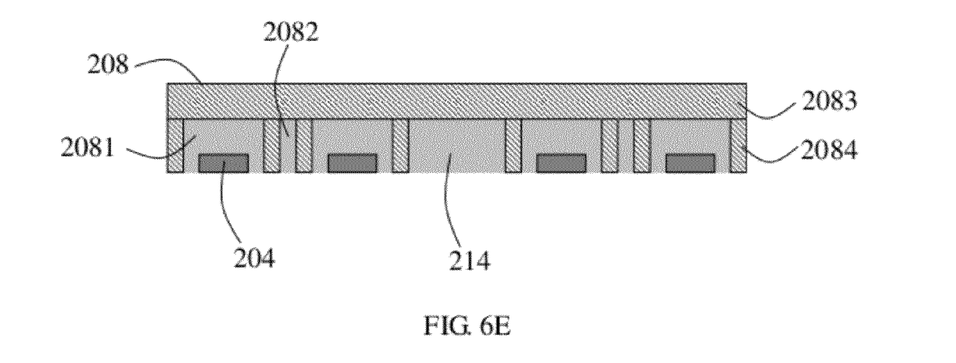

Finally, when the injection has been done, the molding tool 210, the bottom plate 212, the substrate 202 and the first adhesion layer 206 are released, as shown in FIG. 6E. The method of releasing could be any of the current technology, such as the solvent release, the thermal release or the UV release.

In another embodiment, the step of the method further comprises placing an O-ring 216 between the molding tool 210 and the inner cover 208 to avoid overflowing, as shown in FIG. 6C. The O-ring 216 is aligned with the second injecting via 2101 and the first injection via 2085, and the inner radius of those are corresponded with each other.

In another embodiment, the O-ring 216 includes a tube 2161 surrounded by the O-ring 216, and the tube 2161 is inserted into the second injecting via 2101 of the molding tool 210. For example, the inner radius of the tube 2161 of the O-ring 216 is smaller than the inner radius of the second injecting via 2101 and it could be inserted and fixed with the second injecting via 2101. In this embodiment, when the step of injecting the filling material 214 into the cavity 2081 and the runner 2082, the injection tool 2162 encased the tube 2161 (shown in FIG. 4) would be interacted with the tube 2161 to adjust the inside pressure of the cavity 2081 and the runner 2082.

Figure 6F:
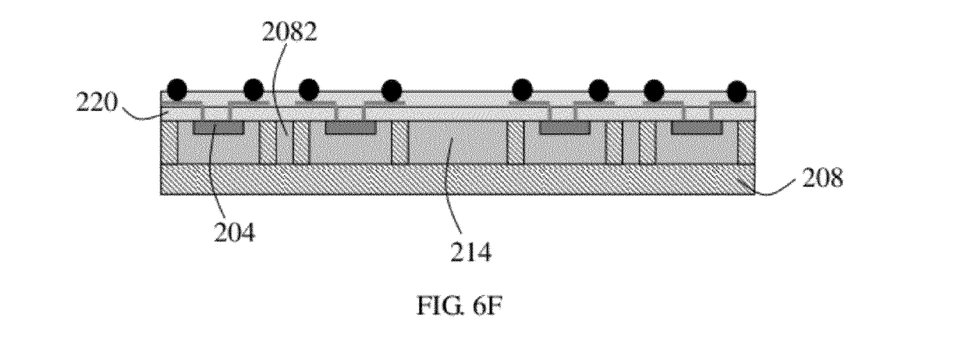
Figure 6G:
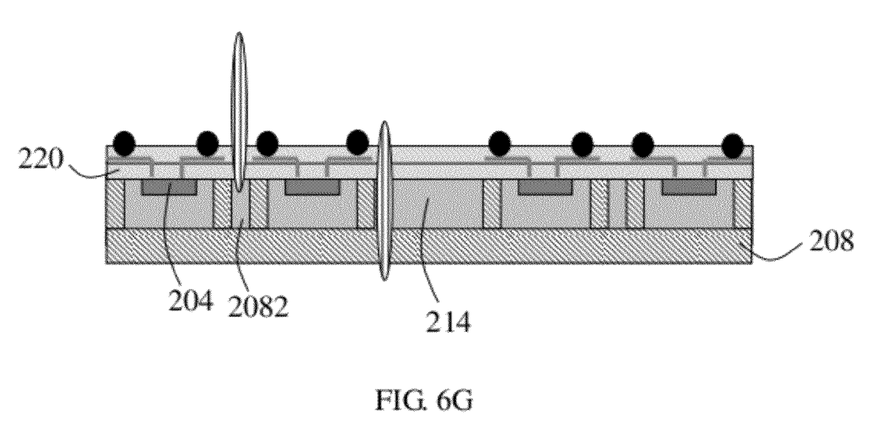

Therefore, the semiconductor device under molding 204 or chip has been embedded in the substrate 202 by this injection molding system 200 and the foregoing method. After the above processes are done, the next steps of the semiconductor manufacturing process may be continued, wherein at least one redistribution layer 218 is formed over the semiconductor device under molding 204, the filling material 214 and the inner cover 208, and the dicing are sawed along the runner 2082, as shown in FIG. 6F and 6G. Moreover, a continued step could be removing a part of the inner cover 208 and exposing the filling material 214 by an etching or grinding process.

One embodiment also provides a semiconductor package structure 200 of injection molding formed by the foregoing method, as shown in FIG. 6E. It comprises at least one semiconductor device 204, an inner cover 208 and a filling material 214. The semiconductor device 204 is configured on a substrate 202 by a first adhesion layer 206. The inner cover 208 with at least one cavity 2081 and runner 2082 is configured over the substrate 202. The filling material 214 is filled into the cavity 2081 and the runner 2082 of the inner cover 208 and the semiconductor device 204 is embedded in the filling material 214. In addition, the structure 200 further comprises at least one redistribution layer 218 formed over the semiconductor device 204, the filling material 214 and the inner cover 208, as shown in FIG. 6F.

Furthermore, if the process continues to the next step for removing a part of the inner cover 208 and exposing the filling material 214 by an etching or grinding process, the semiconductor package structure comprises at least one semiconductor device 204, a plurality of pillars 2084 and a filling material 214. The pillars are placed around each semiconductor device 204. The filling material 214 is filled between the pillars 2084 and semiconductor device 204, and semiconductor device 204 is embedded in the filling material 214.

In view of the foregoing, the injection molding system for semiconductor package and the method thereof provided in the present invention may effectively predigest the processes of package. The injection molding system and the method thereof are easy to use and integrate two or more steps of a conventional package process, the package process effectively being predigested. Therefore, the cost and time of production of a semiconductor package are reduced effectively.

Furthermore, the present invention provides a stable structure utilizing the addition of an inner cover before forming the filling layer. More preferably, the present injection molding system and the method thereof are suitable for use in any level package without incurring additional manufacturing cost.

While the embodiments of the present invention disclosed herein are presently considered to be preferred embodiments, various changes and modifications can be made without departing from the spirit and scope of the present invention. The scope of the invention is indicated in the appended claims, and all changes that come within the meaning and range of equivalents are intended to be embraced therein.

Having described the invention, the following is claimed:

1. A method for injection molding of semiconductor package, comprising the steps of:
   (a) providing a substrate for locating at least one semiconductor device under molding;
   (b) placing said at least one semiconductor device under molding on said substrate by a first adhesion layer;
   (c) placing an inner cover with at least one first injecting via, cavity and runner over said substrate for covering said at least one semiconductor device under molding;
   (d) placing a molding tool with at least one second injecting via on said inner cover and placing a bottom plate under said substrate, wherein the second injecting via is aligned with said at least one first injecting via of said inner cover;
   (e) injecting a filling material into said at least one cavity and runner of said inner cover; and
   (f) releasing said molding tool, said bottom plate, said substrate and the first adhesion layer.

2. The method according to claim 1, further comprising: placing an O-ring between said molding tool and said inner cover, and said O-ring is aligned with said at least one second injecting via.

3. The method according to claim 1, wherein said O-ring includes a tube surrounded by said O-ring.

4. The system according to claim 3, further comprising: placing a second adhesion layer on said at least one semiconductor device under molding for fixing said inner cover.

5. The method according to claim 1, wherein said first adhesion layer is patternable.

6. The method according to claim 1, wherein said bottom plate comprises a heater.

7. The method according to claim 6, further comprising the step of: heating said molding tool by said heater for forming said filling material.

8. The method according to claim 1, wherein the step of releasing said molding tool, said bottom plate, said substrate and said first adhesion layer is processed by solvent release, thermal release or UV release.

9. The method according to claim 1, further comprising the step of: forming at least one redistribution layer over said at least one semiconductor device under molding, said filling material and said inner cover.

10. The method according to claim 1, further comprising the step of: removing a part of said inner cover and said filling material is exposed by an etching or grinding process.

11. A semiconductor package structure formed by an injection molding method of claim 10, said semiconductor package structure comprising:
   at least one semiconductor device;
   a plurality of pillars placed around each said at least one semiconductor device;
   a filling material filled between said plurality of pillars and said at least one semiconductor device, wherein said at least one semiconductor device is embedded in said filling material.

12. The structure according to claim 11, further comprising a second adhesion layer formed on said at least one semiconductor device for fixing said inner cover.

13. The structure according to claim 11, wherein said filling material is a thermoplastic material.

14. The structure according to claim 11, further comprising at least one redistribution layer over said at least one semiconductor device, said filling material and said plurality of pillars.

15. The method according to claim 1, wherein said molding tool includes a checking window for checking a status of said filling material.

16. The method according to claim 1, wherein said at least one cavity and runner of said inner cover is defined by a top plate and a plurality of pillars arranged under the bottom of said top plate.

17. The method according to claim 16, wherein each pair of said pillars is placed by both sides of each said at least one semiconductor device under molding.

18. A semiconductor package structure formed by an injection molding method of claim 1, said semiconductor package structure comprising:
   at least one semiconductor device configured on a substrate by a first adhesion layer;
   an inner cover with at least one cavity and runner configured over said substrate locating said semiconductor device under molding; and
   a filling material filled into said at least one cavity and runner, said at least one semiconductor device is embedded in said filling material.

19. The structure according to claim 18, wherein said first adhesion layer is patternable.

20. The structure according to claim 18, further comprising a second adhesion layer formed on said at least one semiconductor device for fixing said inner cover.

21. The structure according to claim 18, wherein said filling material is a thermoplastic material.

22. The structure according to claim 18, further comprising at least one redistribution layer over said at least one semiconductor device, said filling material and said inner cover.

23. The structure according to claim 18, wherein said at least one cavity of said inner cover is defined by a top plate and a plurality of pillars arranged under the bottom of said top plate.

24. The structure according to claim 23, wherein each pair of said pillars is placed by both sides of each said at least one semiconductor device.

* * * * *